US009800048B2

(12) United States Patent
Duby et al.

(10) Patent No.: US 9,800,048 B2
(45) Date of Patent: *Oct. 24, 2017

(54) INTEGRATED CIRCUIT WITH INTERFACE CIRCUITRY, AND AN INTERFACE CELL FOR SUCH INTERFACE CIRCUITRY

(71) Applicant: ARM Limited, Cambridge (GB)

(72) Inventors: Jean-Claude Duby, Grenoble (FR); Mikael Rien, Grenoble (FR)

(73) Assignee: ARM Limited, Cambridge (GB)

( * ) Notice: Subject to any disclaimer, the term of this patent is extended or adjusted under 35 U.S.C. 154(b) by 153 days.

This patent is subject to a terminal disclaimer.

(21) Appl. No.: 14/728,982

(22) Filed: Jun. 2, 2015

(65) Prior Publication Data

US 2015/0349526 A1 Dec. 3, 2015

(30) Foreign Application Priority Data

Jun. 3, 2014 (GB) .................................. 1409867.7

(51) Int. Cl.
*H02J 1/00* (2006.01)

(52) U.S. Cl.
CPC ...... *H02J 1/00* (2013.01); *H01L 2224/16225* (2013.01); *H01L 2924/15311* (2013.01); *Y10T 307/25* (2015.04)

(58) Field of Classification Search
CPC ................ G06F 1/3243; Y10T 307/25; H01L 2224/16225; H01L 2924/15311

(Continued)

(56) References Cited

U.S. PATENT DOCUMENTS 5,796,299 A 8/1998 Sei et al.
6,078,068 A 6/2000 Tamura
(Continued)

FOREIGN PATENT DOCUMENTS

EP 2244292 A1 10/2010

OTHER PUBLICATIONS

UKIPO Search Report; GB 1409867.7; Nov. 17, 2014.
UKIPO Search Report; GB 1409865.1; Nov. 18, 2014.

*Primary Examiner* — Robert Deberadinis
(74) *Attorney, Agent, or Firm* — Pramudji Law Group PLLC; Ari Pramudji (57) ABSTRACT

An integrated circuit is provided with interface circuitry used to provide an interface between functional circuitry of the integrated circuit and components external to the integrated circuit. The functional circuitry is configured to operate from a first power supply and has a power supply distribution network associated therewith providing the first power supply to the functional components of the functional circuitry. The interface comprises a plurality of interface cells that have interface components operating from a second power supply different to the first power supply. A power supply line structure is shared by the plurality of interface cells, and arranged to provide the second power supply to the interface components. In addition, at least a subset of the interface cells include additional interface components that operate from the first power supply. Each such interface cell is arranged to have independent connection to the power supply distribution network in order to receive the first power supply. This avoids the need to incorporate any lines within the power supply line structure for provision of the first power supply to such additional interface components.

20 Claims, 11 Drawing Sheets (58) Field of Classification Search
USPC .......................................................... 307/147
See application file for complete search history.

(56) References Cited

U.S. PATENT DOCUMENTS

| | | |
|---|---|---|
| 2006/0095872 A1 | 5/2006 | McElvain et al. |
| 2007/0044057 A1 | 2/2007 | Kitani et al. |
| 2007/0097573 A1 | 5/2007 | Agata et al. |
| 2008/0111255 A1 | 5/2008 | Matsuoka |
| 2008/0169486 A1 | 7/2008 | Toyoshima et al. |
| 2008/0212353 A1 | 9/2008 | Huang et al. |
| 2008/0253045 A1 | 10/2008 | Sato et al. |
| 2008/0257583 A1 | 10/2008 | Li |
| 2009/0212413 A1 | 8/2009 | Fishley et al. |
| 2010/0025859 A1 | 2/2010 | Inoue |
| 2015/0346803 A1* | 12/2015 | Duby .................. G06F 1/26 713/300 |

* cited by examiner

INTEGRATED CIRCUIT WITH INTERFACE CIRCUITRY, AND AN INTERFACE CELL FOR SUCH INTERFACE CIRCUITRY

FIELD OF THE INVENTION

The present invention relates to an integrated circuit with interface circuitry, and to an interface cell for such interface circuitry.

BACKGROUND OF THE INVENTION

Typically an integrated circuit will comprise the functional circuitry needed to perform the processing functions of the integrated circuit, along with interface circuitry (often referred to as input/output (I/O) circuitry for providing an interface between the functional circuitry and components external to the integrated circuit. Often the interface circuitry takes the form of an I/O ring surrounding the functional circuitry and incorporating all of the required I/O cells to facilitate the input/output requirements of the integrated circuit.

Typically the various I/O cells are placed side by side around the I/O ring, and incorporate a power supply line structure which extends around the I/O ring to provide the required power supplies to the I/O cells.

Whilst the functional circuitry of the integrated circuit will typically operate from a first power supply, many of the components within the interface circuitry will operate from a second power supply different to the first power supply. However, in addition, there are typically a number of interface components within the interface circuitry which need to operate from the first power supply. Accordingly, it is typically the case that the power supply line structure provided within the I/O ring needs to provide both the first power supply and the second power supply. Additionally, the power supply line structure has to be sized sufficiently to support a current carrying constraint of the interface circuitry. In particular, the I/O cells will typically include electrostatic discharge (ESD) components used to provide ESD protection during ESD events, and as a result the various lines within the power supply line structure need to be sized sufficiently to manage the relatively large currents that arise during such ESD events.

Often the various supply lines of the power supply line structure are provided within the upper metal layers (also referred to as the thick metal layers) of the integrated circuit where they can be sized appropriately to manage the current drawn during such ESD events. However, this results in the area occupied by the power supply line structure becoming relatively large, and in particular the sizing requirements of the power supply line structure are becoming a limiting constraint when seeking to reduce the size of the I/O cells.

As the size of integrated circuits continues to decrease, there is an ever increasing pressure to reduce the size of the I/O cells used to form the interface circuitry of the integrated circuit. This pressure applies not only when the interface circuitry is arranged as an I/O ring as discussed above, but also in other configurations of interface circuitry, such as in area array System-on-Chips (SoCs) where several clusters of I/O cells are distributed within the integrated circuit instead of being formed as a ring around the periphery of the chip. In all of these various arrangements, the above-mentioned current carrying constraints (typically due to ESD protection requirements) have limited the reductions that can be made in the size of the power supply line structure provided within the I/O cells, thus limiting the extent to which the area occupied by the I/O circuitry can be reduced, and hence limiting the reductions that can be made in the size of the integrated circuit.

Accordingly, it would be desirable to provide an improved arrangement for providing the necessary power supplies to the interface circuitry of an integrated circuit, whilst enabling the current carrying requirements to continue to be met.

SUMMARY OF THE INVENTION

Viewed from the first aspect, the present invention provides an integrated circuit comprising: functional circuitry comprising functional components configured to perform processing functions required by the integrated circuit, the functional circuitry configured to operate from a first power supply; a power supply distribution network associated with the functional circuitry and configured to provide the first power supply to the functional components; interface circuitry configured to provide an interface between the functional circuitry and components external to the integrated circuit, the interface circuitry comprising a plurality of interface cells having interface components configured to operate from a second power supply different to the first power supply; a power supply line structure shared by the plurality of interface cells, and configured to provide the second power supply to the interface components; and at least a subset of said interface cells further comprising additional interface components configured to operate from the first power supply, each interface cell in said at least a subset having an independent connection to the power supply distribution network in order to receive the first power supply.

In accordance with the present invention, the interface cells of the interface circuitry have interface components that operate from a second power supply different to the first power supply used by the functional components of the functional circuitry. In addition, at least a subset of the interface cells comprise additional interface components that operate from the first power supply. A power supply line structure is provided for the plurality of interface cells and is shared by those cells in order to provide the second power supply to the interface components. However, the power supply line structure is not used to also provide the first power supply required by the additional interface components. Instead, each interface cell containing such additional interface components has an independent connection enabling it to be connected to a power supply distribution network associated with the functional circuitry. As a result, there is no need to provide any lines within the power supply line structure for the provision of the first power supply, hence enabling the area of the power supply line structure to be reduced when compared with typical prior art arrangements.

Further, the current carrying constraint can still be met. In particular, the main current carrying constraint in most practical applications is that imposed by the ESD protection requirements, and the current occurring during such ESD events is typically drawn through the supply lines associated with the second power supply. Since the power supply line structure of the present invention still provides the second power supply, it can hence readily be sized appropriately to manage such ESD currents. Further whilst there will also be some current constraints associated with the provision of the first power supply, those constraints can readily be managed by the power supply distribution network associated with the functional circuitry. Accordingly, through use of the approach of the present invention the area associated with power supply line structure can be significantly reduced, whilst still enabling the current carrying constraints to be met. As a result, the size of the interface cells can be reduced, hence enabling a reduction in the overall size of the integrated circuit.

The power supply line structure can be provided in a variety of ways. However, in one embodiment, each interface cell incorporates a power supply line section extending across its width, and the power supply line structure is formed from multiple power supply line sections by positioning the interface cells in an abutting arrangement such that the power supply line section in one interface cell contacts the power supply line section in an adjacent interface cell.

Further, there are a number of ways in which the interface cells can be arranged to have an independent connection to the power supply distribution network of the functional circuitry. However, in one embodiment, each interface cell in said at least a subset includes a connection area from which the independent connection to the power supply distribution network is made in order to receive the first power supply. The connection area can take a variety of forms, but in one embodiment comprises one or more connection pins. In particular, in one embodiment, there will be one or more connection pins associated with an operating voltage level for the first power supply and one or more connection pins associated with a ground voltage level for the first power supply.

The interface circuitry can be arranged in a variety of ways, but in one embodiment is arranged as an interface ring provided around a periphery of the functional circuitry, and the power supply line structure provides at least one power supply line extending around the interface ring.

There are a number of ways in which the individual interface cells can be arranged within the interface ring. However, in one embodiment, each interface cell that has at least one interface component operating from the first power supply is arranged within the interface ring such that its connection area is positioned nearer the periphery of the functional circuitry than the power supply line structure. This facilitates an easier connection to the power supply distribution network of the functional circuitry.

In one embodiment, the power supply distribution network is provided in one or more layers, and is configured to overlie the functional circuitry.

Furthermore, in one embodiment the power supply line structure occupies at least one layer used to provide the power supply distribution network. As a result, it is beneficial in such an embodiment to have the connection area nearer the periphery of the functional circuitry than the power supply line structure, since this enables connections to be made between the power supply distribution network and that connection area without any re-routing around the power supply line structure being necessary.

The a number of ways in which the interface cells can be arranged to have an independent connection to the power supply distribution network in order to receive the first power supply. In one embodiment, the independent connection includes a connection path extending within at least one of the layers used for the power supply distribution network.

However, in an alternative embodiment the independent connection includes a connection path extending within an additional layer overlying the one or more layers providing the power supply distribution network. The additional layer can take a variety of forms but in one embodiment is provided by a redistribution layer (RDL). In particular, each interface cell can be arranged to have a pad access terminal, and the redistribution layer may be used to provide a connection path between the pad access terminal and a bump connection external to the integrated circuit. Where the integrated circuit provides such a redistribution layer, that redistribution layer can also be used to provide the further connection paths between the relevant I/O cells and the power supply distribution network of the functional circuitry in order to allow the first power supply to be provided to those I/O cells.

The power supply line structure can be configured in a variety of ways. However, typically it will have one or more supply lines configured to provide an operating voltage level for the second power supply, and/or one or more supply lines configured to provide a ground voltage level for the second power supply. The power supply distribution network can also be configured in a variety of ways, but in one embodiment comprises a power grid comprising an array of supply lines extending in orthogonal directions, also often referred to as a power mesh. Such power grids are designed to have a homogeneous current distribution, and accordingly an additional beneficial side effect that results from the use of such a power grid to also provide the power supply to interface cells within the interface circuitry is that the power distribution within those interface cells will be better than in known prior art mechanisms where the first power supply is propagated within a power supply line structure of the interface cells. In particular, in such prior art approaches, a dedicated power supply I/O cell is typically distributed regularly throughout the I/O cells of the interface circuitry to propagate the first power supply over the power supply line structure, and this leads to some variation in the power distribution.

Viewed from a second aspect, the present invention provides an interface cell for use within interface circuitry of an integrated circuit, the interface circuitry providing an interface between functional circuitry of the integrated circuit operating from a first power supply and components external to the integrated circuit, the interface circuitry comprising: a power supply line section configured for coupling to power supply line sections of other interface cells to provide a power supply line structure shared with said other interface cells, in order to provide to at least one interface component within the interface circuitry a second power supply different to the first power supply; at least one additional interface component configured to operate from the first power supply; and a connection area configured for making an independent connection to a power supply distribution network associated with the functional circuitry, in order to provide said first power supply to the at least one additional interface component.

The interface cell may also include at least one interface component configured to operate from the second power supply, and configured for connection to the power supply line structure.

Viewed from a third aspect, the present invention provides a computer storage medium comprising a cell library, the cell library including an interface cell in accordance with the second aspect of the present invention. The computer storage medium can take a variety of forms, including both non-transitory and transitory forms, but in one embodiment is a non-transitory computer storage medium.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
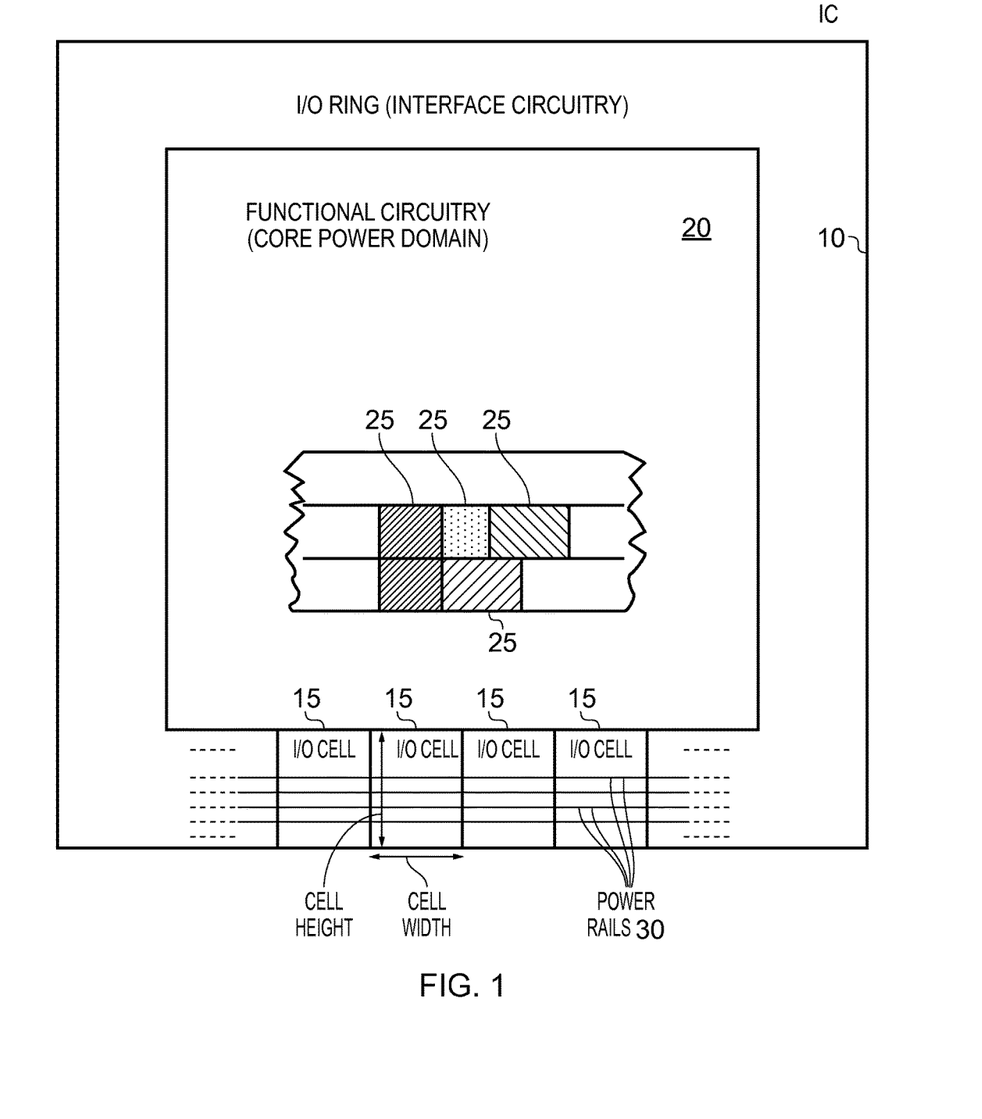
FIG. 1 schematically illustrates an integrated circuit in which the techniques of embodiments can be employed.

FIG. 1 schematically illustrates an integrated circuit in which the techniques of embodiments can be employed. As shown in FIG. 1, the integrated circuit includes functional circuitry 20 comprising a plurality of functional components 25 that are configured to perform the required processing functions of the integrated circuit. There are a number of ways in which the individual functional components can be provided within the functional circuitry 20. For example, in accordance with one known technique, automated tools are provided which use a functional design of a planned integrated circuit (for example in the form of a gate level netlist or a Register Transfer Language higher level representation of the design) and a cell library providing a set of standard cells (standard cells defining the functional components and being "building blocks" for putting together the layout of the integrated circuit accordingly to the functional design) in order to generate the layout of an integrated circuit. In one embodiment, at least some of the functional components 25 of the functional circuitry 20 are formed from such standard cells.

In the embodiment of FIG. 1, the functional circuitry 20 is surrounded by an I/O ring 10 forming interface circuitry for providing an interface between the functional circuitry and components external to the integrated circuit. Typically, the I/O ring consist of a plurality of I/O cells 15 for providing particular I/O connections. As with the cell library used to provide standard cells when constructing the functional components of the functional circuitry, a cell library may also be used to provide the various I/O cells 15 that can be used to construct the I/O ring.

As shown in FIG. 1, the I/O cells are typically placed side by side in an abutting arrangement, and each I/O cell will have a cell width and a cell length (the cell length often being referred to as a cell height). Each I/O cell will typically include a power supply line section extending across its width, and a power supply line structure is then formed around the I/O ring from multiple power supply line sections by positioning the interface cells in an abutting arrangement such that the power supply line section in one interface cell contacts the power supply line section in an adjacent interface cell. The resultant power supply line structure will typically consist of a plurality of power lines 30 (also referred to herein as power rails) extending around the I/O ring, and used to provide the required power supply to the interface components of the I/O cells.

Typically the functional circuitry 20 will operate in a core power domain, employing a first power supply. In contrast, the interface circuitry 10 will predominantly operate in an I/O power domain employing a second power supply different to the first power supply. Whilst the majority of the components of each I/O cell will typically operate from this second power supply, many of the I/O cells will typically also include a small number of interface components that operate from the first power supply of the core power domain. Accordingly, it has typically been necessary for the various power lines 30 of the power supply line structure within the I/O ring to be able to provide both the first power supply and the second power supply.

Figure 2:
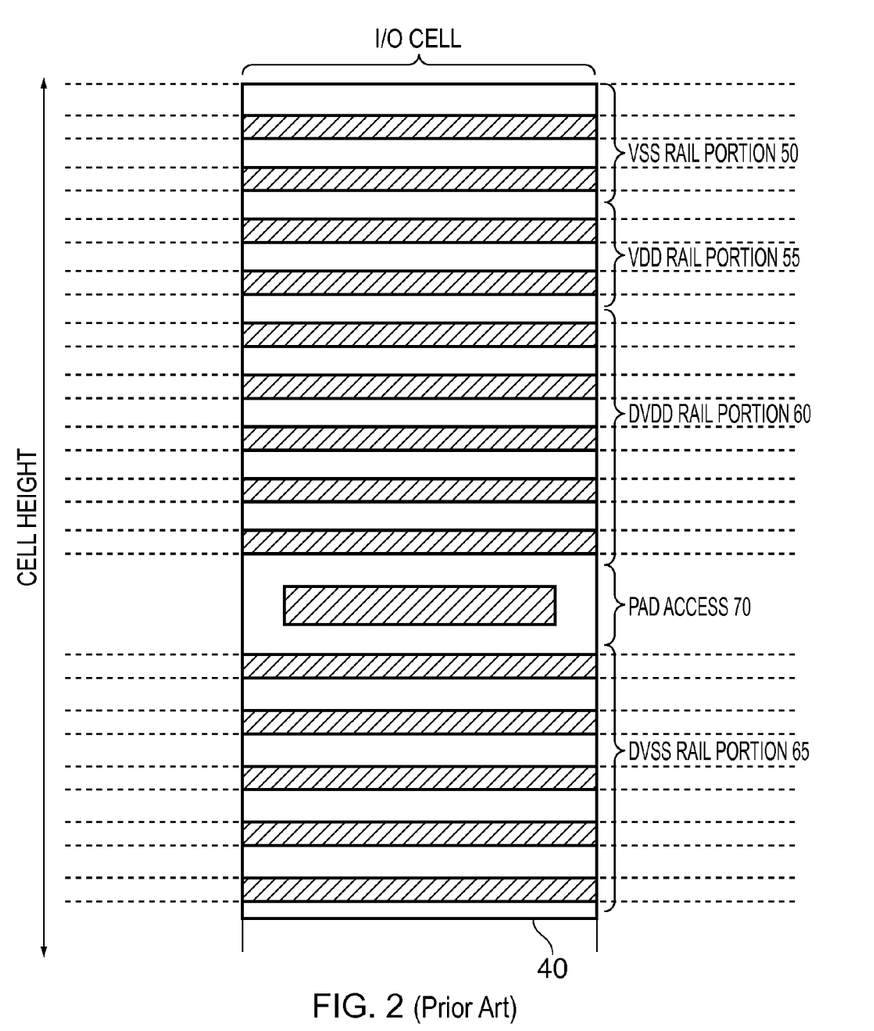
FIG. 2 illustrates a power supply line section associated with an I/O cell in accordance with a prior art arrangement.

FIG. 2 schematically illustrates a known prior art power supply line section provided within an individual I/O cell 40, and arranged to be positioned in an abutting arrangement with the corresponding power supply line sections in adjacent I/O cells in order to produce the power supply line structure. In the example shown, the second power supply of the I/O voltage domain is provided by an operating voltage portion 60 (also referred to herein as the DVDD rail portion) and a ground voltage portion 65 (also referred to herein as the DVSS rail portion.) As mentioned earlier, the majority of the interface components within the I/O cell will take their power supply from these two voltage rail portions.

In addition, two further portions are provided to provide the operating voltage and ground voltage supplies of the first power supply, as illustrated by the VDD rail portion 55 and the VSS rail portion 50 in FIG. 2.

In the embodiment shown in FIG. 2, each of the various portions 50, 55, 60, 65 of the power supply line section is actually implemented by a plurality of metal lines extending across the width of the I/O cell. The number of individual metal lines associated with the DVDD rail portion 60 and the DVSS rail portion 65 will typically be larger than the number of lines provided for the VDD rail portion 55 and the VSS rail portion 50. This is due to the fact that the current carrying requirements in the I/O power domain are typically significantly higher. This is due to the interface components in the I/O cell predominantly using the second power supply of the I/O power domain, and also due to the fact that the relatively high currents observed during ESD events are predominantly channelled through those rail portions 60, 65. The VDD and VSS rail portions typically have to be capable of handling lower currents, and hence do not require as many individual lines.

The actual voltage levels of the first and second power supplies may vary dependant on embodiment. Whilst the first power supply may be 1 Volt or less, the second power supply used in the I/O power domain is typically higher, for example 1.5 Volts, 1.8 Volts or 2.5 Volts.

As also shown in FIG. 2, a pad access connection 70 is typically provided within the same metal layers used to provide the various rail portions, this allowing the I/O cell to be connected to components external to the integrated circuit. As shown in FIG. 2, the various rail portions forming the power supply line section occupy most of the cell height of the I/O cell, and indeed the size requirements of these various rail portions typically places a limit on how much the cell height can be reduced in any particular implementation.

Figure 3:
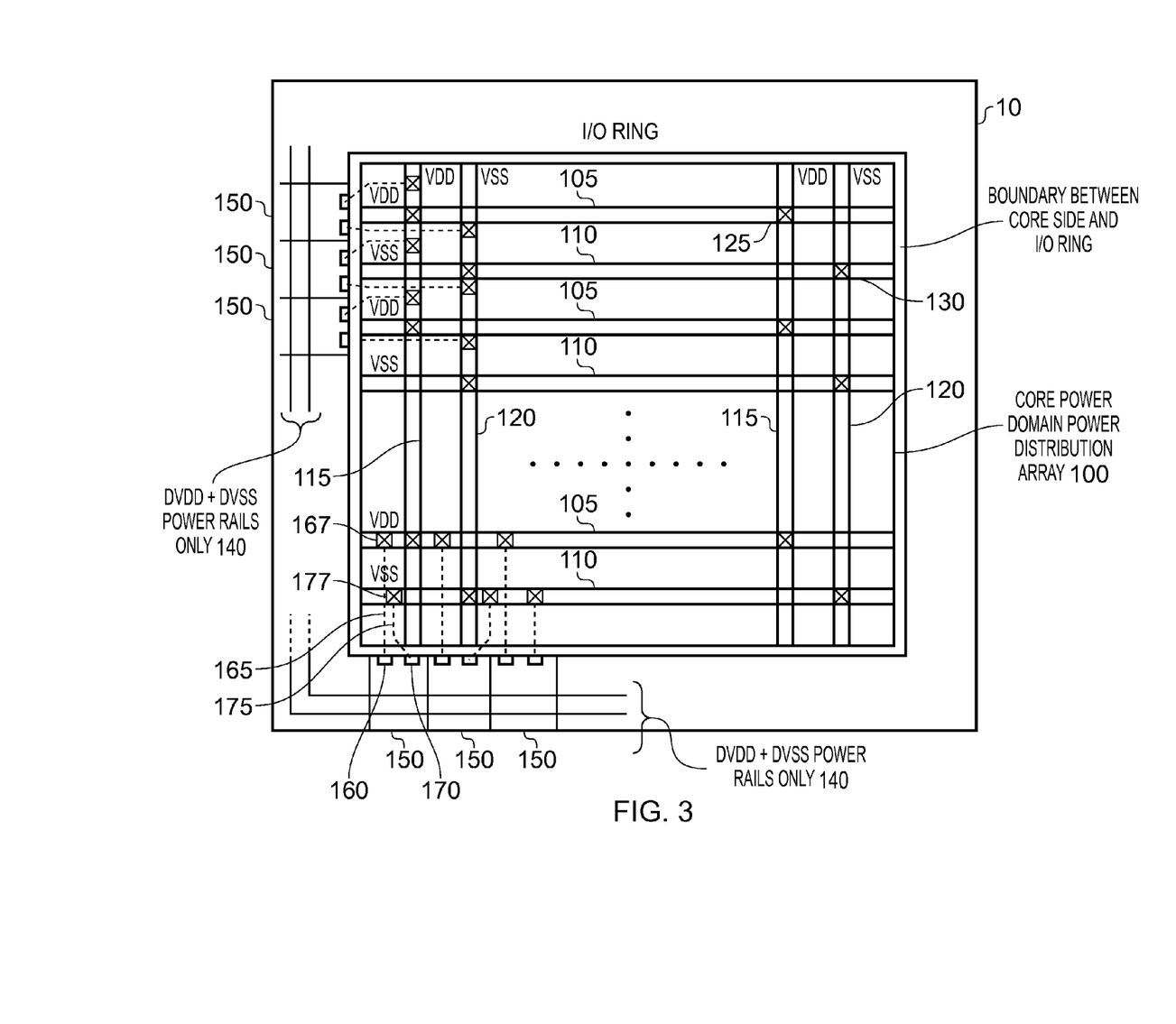
FIG. 3 illustrates how the I/O cells of one embodiment employ a reduced size power supply line section, along with connections to enable another power supply to be provided from a power grid associated with the functional circuitry of the integrated circuit.

In accordance with the described embodiment, the power supply line section within each I/O cell is redesigned so as to enable a reduction in the area occupied by that power supply line section, and hence enable a reduction in the size of the I/O cell. The manner in which this is achieved is illustrated schematically in FIG. 3. In particular, as shown in FIG. 3, the power supply line structure 140 extending around the I/O ring 10 provides the DVDD and DVSS power rails only (along with any pad access connection required), but there are no VDD rails or VSS rails provided within the power supply line structure. Instead, the individual I/O cells 150 include connection pins 160, 170 to enable the I/O cells to be connected to a power distribution array 100 provided in association with the functional circuitry. Such a power distribution array will also be referred to as a power grid or a power mesh. As shown in FIG. 3, the power distribution array 100 consists of an array of supply lines extending in orthogonal directions and overlying the functional components of the functional circuitry 20. In the arrangement of FIG. 3, alternating VDD and VSS lines are provided in both the horizontal and vertical directions, with the horizontal and vertical VDD lines being provided in different metal layers and connected using vias 125, and similarly the horizontal and vertical VSS lines are provided in different metal layers and are connected using vias 130.

Considering the lower left I/O cell 150 shown in FIG. 3, the connection pin 160 is connected via a connection path 165 and a via 167 with at least one VDD line (in this example one of the horizontal VDD lines 105). Similarly, the connection pin 170 is connected via a connection path 175 and via 177 with at least one of the VSS lines (in this example one of the horizontal VSS lines 110). It will be appreciated from FIG. 3 that all of the other I/O cells are similarly connected to the VDD and VSS lines within the power distribution array 100 of the functional circuitry.

Figure 4:
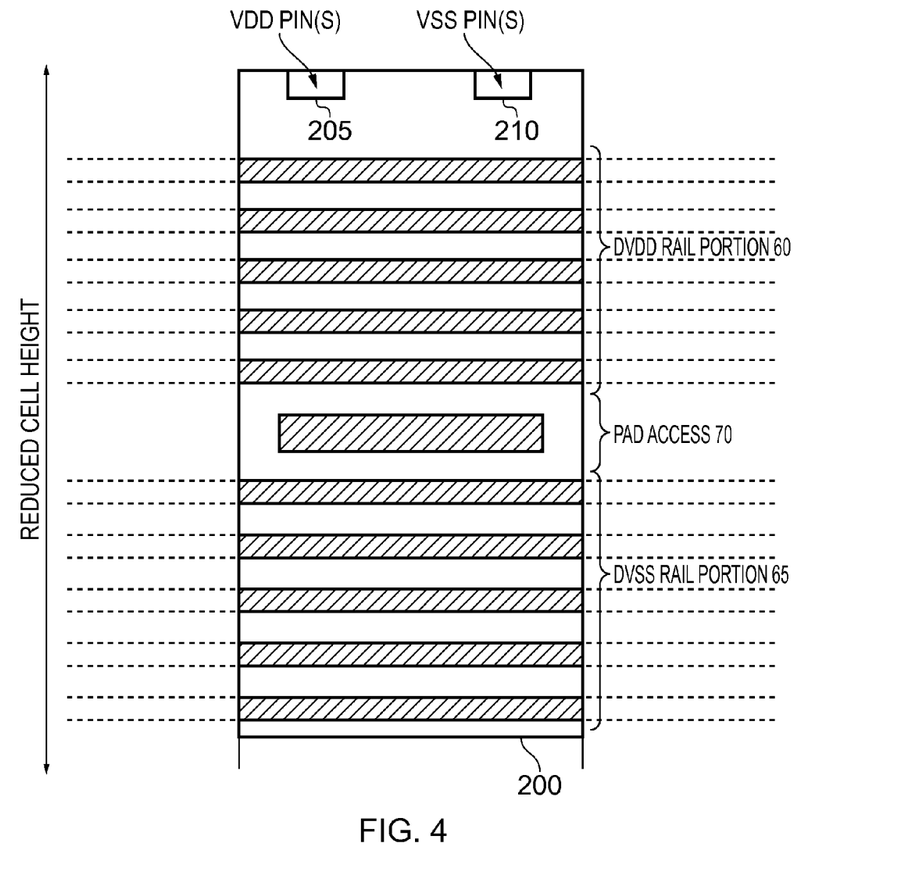
FIG. 4 illustrates a power supply line section associated with an I/O cell in accordance with one embodiment.

By use of such an arrangement, the cell height of the individual I/O cells can be significantly reduced as illustrated in FIG. 4. From a comparison of FIG. 4 with FIG. 2 it will be seen that the DVDD rail portion 60 and DVSS rail portion 65 are unchanged, as is the pad access connection 70. However, there are no VDD or VSS lines and instead the two connection pins 205, 210 are provided for connection to the power distribution array 100 of the functional circuitry. This reduction in the I/O cell height can give rise to a significant reduction in the required size for the I/O ring 10, hence enabling a significant reduction in the area of the integrated circuit.

Figure 5:
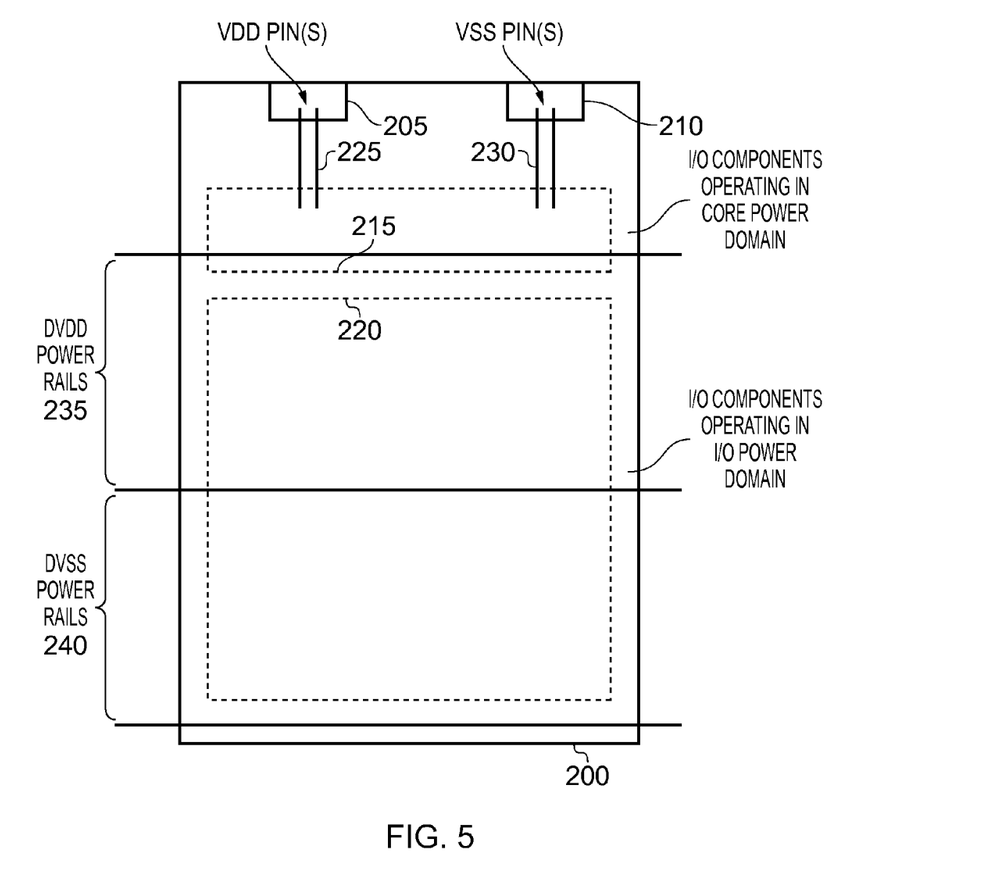
FIG. 5 illustrates how the connection pins shown in FIG. 4 can be used to provide a core power supply to certain I/O components within the I/O cell of one embodiment.

FIG. 5 illustrates how the I/O components within the I/O cell can be connected to the required power supplies. In particular, the majority of the components 220 are components operating in the I/O power domain, and they can be connected in the standard manner to the DVDD power lines 235 and the DVSS power lines 240 in order to provide the second power supply to those components. A small number of the components 215 will however be operating in the core power domain using the first power supply. Connections path 225, 230 can be provided from the associated VDD and VSS pins 205, 210 in order to propagate the first power supply to those components.

Figure 6A:
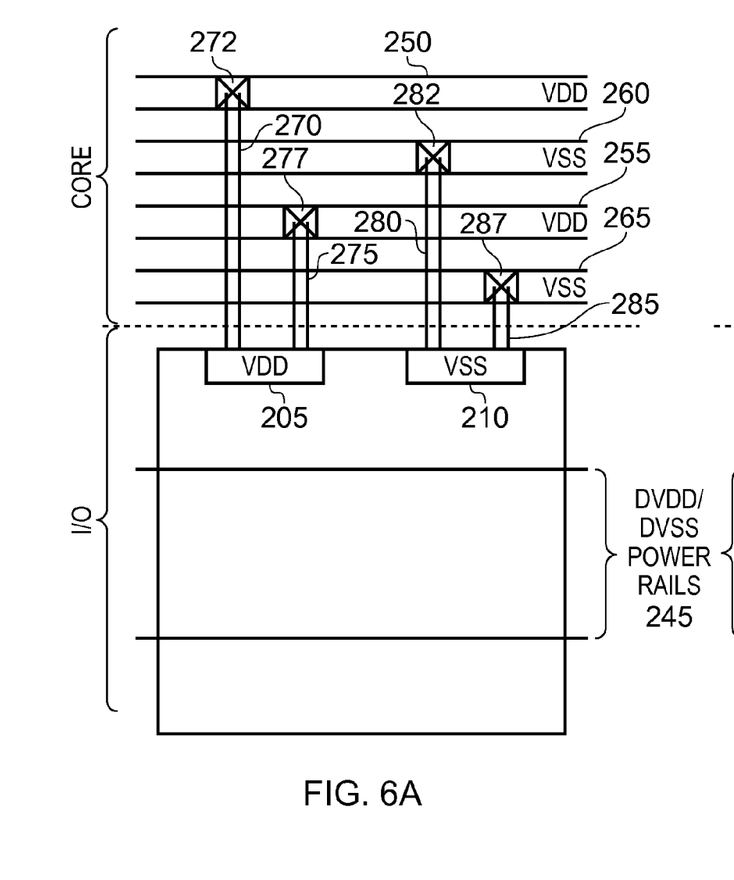
FIGS. 6A to 6D schematically illustrate different arrangements for connecting the I/O cells to the power grid of the functional circuitry in accordance with embodiments.

There are many different ways in which the connection pins can be configured within the individual I/O cells, and many different ways in which those connection pins can be connected to one or more lines within the power grid 100 of the functional circuitry. FIGS. 6A to 6D illustrate a few examples. In FIG. 6A, the connection pins are relatively wide pins 205, 210, whilst in FIG. 6B multiple smaller pins 300, 305, 310, 315 are provided. In the example of FIG. 6A, the pin 205 is provided with separate connection paths 270, 275 and associated vias 272, 277 to the VDD lines 250 and 255 within the power grid of the functional circuitry. Similarly, the VSS connection pin 210 is connected via separate connection paths 280, 285 along with associated vias 282, 287 to the VSS lines 260, 265 within the power grid of the functional circuitry. It will be appreciated that each connection pin may be instead connected to more than two lines, or indeed each pin may be connected to a single line.

Figure 6B:
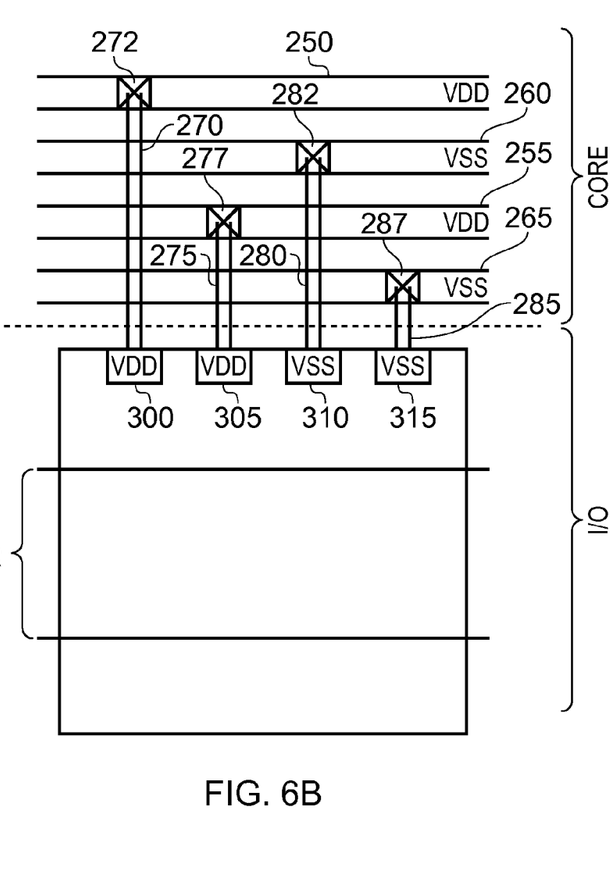

In FIG. 6B, each of the smaller connection pins is connected to separate lines using the same connection paths and vias as illustrated in FIG. 6A.

Figure 6C:
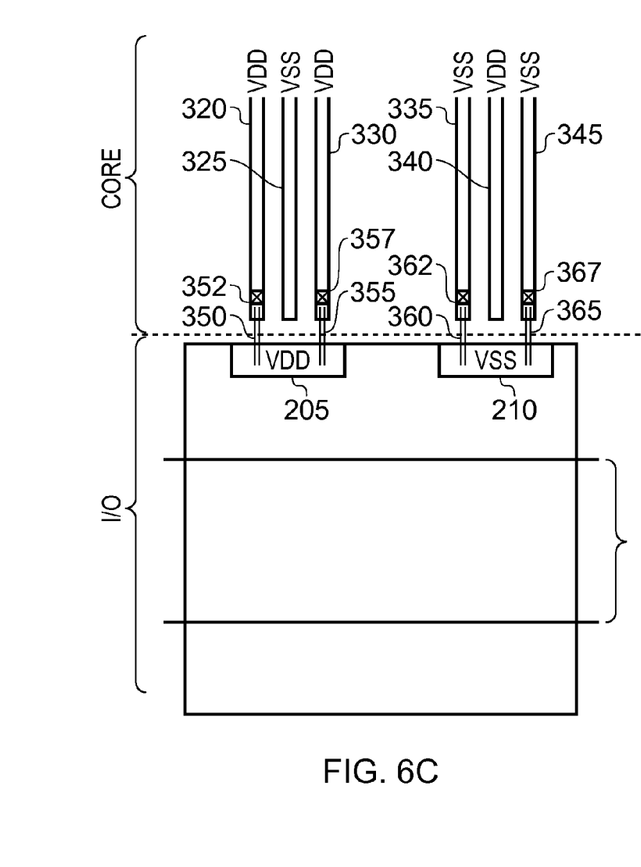
Figure 6D:
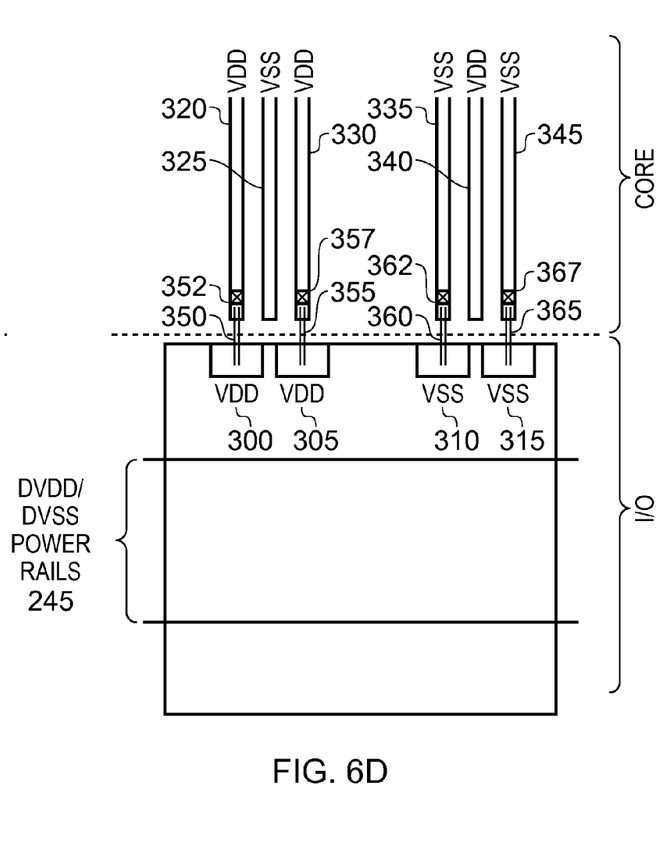

Whilst in FIGS. 6A and 6B, the I/O cells are connected to VDD and VSS lines within the power grid that extend along the width dimension of the I/O cells, in FIGS. 6C and 6D the I/O cells are actually connected to VDD and VSS lines within the power grid that extend in the length/height dimension of the I/O cell. Hence, the VDD pin 205 is connected to two VDD lines 320, 330 via associated connection paths 350, 355 and corresponding via connections 352, 357. The intervening VSS line 325 is not used. Similarly, the VSS connection pin 210 is connected to the two VSS lines 335, 345, via associated connection paths 360, 365 and associated vias 362, 367. The VDD line 340 is not used.

FIG. 6D illustrates the same arrangement of connection paths and vias, but with the multiple narrower connection pins 300, 305, 310, 315 discussed earlier with reference to the FIG. 6B example. It will be appreciated that FIGS. 6A to 6D are merely four example arrangement that could be used, and it will be appreciated that there will be many different ways in which the I/O cells can be arranged to be connected to various power lines within the power grid of the functional circuitry.

In all of the examples of FIGS. 6A to 6D, DVDD and DVSS power rails 245 extend across the I/O cell for provision of the second power supply to components of the I/O cell.

In one embodiment, the various connection paths between the connection pins in the I/O cells and the power lines in the power grid of the functional circuitry can be formed within the same layers of the integrated circuit used to provide the power grid and the connection pins. In particular, it will be appreciated that there will typically be multiple metal layers and intervening insulating layers used to provide the various lines of the power grid, and standard routing techniques can be used to provide metal connections between the connection pins of the I/O cell and the required metal layers within the power grid.

However, in an alternative embodiment, an additional layer above the power line layers may also be used to facilitate such connections, as will be discussed below.

Figure 7:
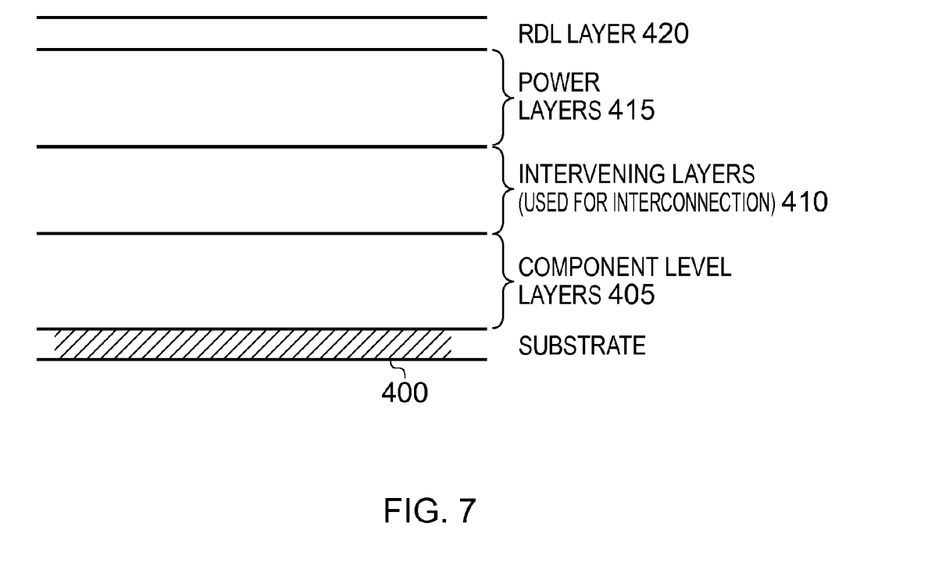
FIG. 7 schematically illustrates various layers provided within the integrated circuit in accordance with one embodiment.

As shown in FIG. 7, the integrated circuit is formed of a plurality of layers established upon a substrate 400, which may for example be a silicon substrate. In particular, a first plurality of layers established over the substrate 400 form component level layers 405 in which individual functional components are formed within the integrated circuit. In addition, power grid layers 415 are also provided for establishing the power distribution array 100 for the various functional components, and a number of intervening layers 410 are then provided between the power grid layers 415 and the components level layers 405 to provide interconnections between the functional components. These interconnections can take a variety of forms, for example, direct point-to-point connections, bussing structures, etc. In some embodiments, these intervening layers may also be used to perform power biasing functions.

The I/O cells provided within the I/O ring will occupy almost the entire vertical height of the integrated circuit, extending through the component level layers 405, the intervening layers 410, and typically the power grid layers 415. The power supply line sections and pad access connections will typically be provided in the upper metal layers provided as part of the power layers 415.

As shown in FIG. 7, there may also be at least one additional layer above the power layers 415. For example, a redistribution (RDL) layer 420 may be provided to allow connection of certain components to other components external to the integrated circuit. For example, considering the earlier mentioned pad access connections 70 within the various I/O cells, the redistribution layer can be used to provide a connection path between the pad access terminal of an I/O cell and a bump connection external to the integrated circuit. Such bump connections are provided in flip-chip implementations, as will be discussed further with reference to FIG. 8.

Figure 8:
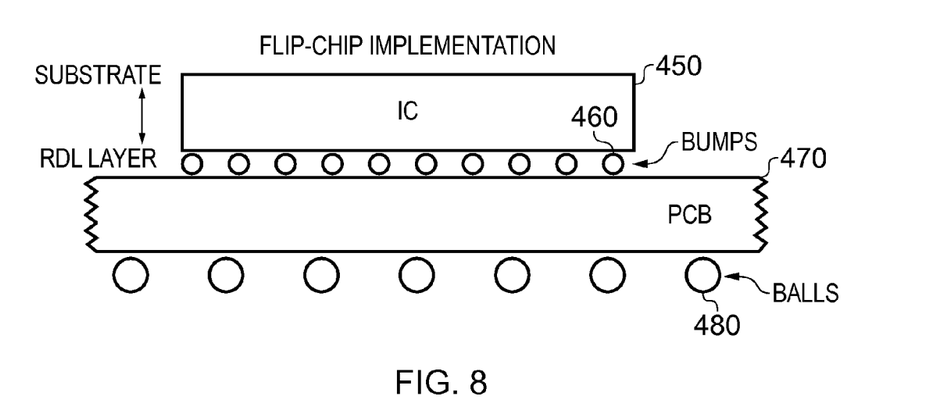
FIG. 8 schematically illustrates a flip-chip implementation in which the techniques of certain embodiments may be utilised.

FIG. 8 schematically illustrates a flip-chip implementation. In such an implementation, a printed circuit board (PCB) 470 is provided with a number of connection balls 480, and each integrated circuit provided on the PCB 470 is coupled to the PCB via a plurality of bumps 460. One such integrated circuit is shown by the integrated circuit 450 in FIG. 8. The integrated circuit is mounted onto the PCB in an inverted ("flipped") arrangement, such that the substrate is remote from the PCB, and the RDL layer provides the contact layer for the bumps 460 connecting the integrated circuit 450 with the PCB 470.

The bumps are formed as an array in both the x and y dimensions, providing a great deal of flexibility for connection of external signals to particular blocks of functional components within the integrated circuit. In particular, there is no need for all such signals to be routed onto the integrated circuit via the I/O ring. Further, the I/O cells can be connected via their pad access connection 70 to a wide variety of different bump connections, hence increasing routing flexibility.

Figure 9A:
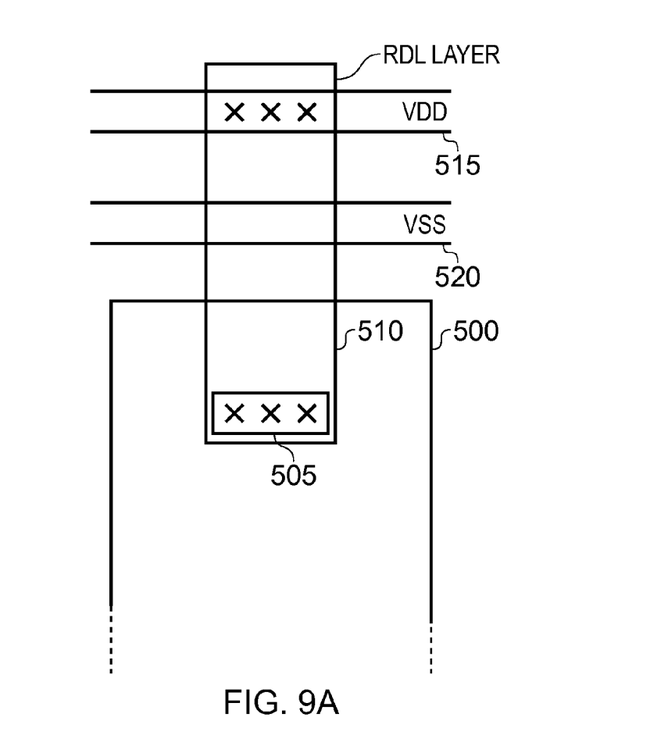
FIGS. 9A and 9B schematically illustrate how the RDL layer may be used in one embodiment to provide connections between the I/O cells and the power grid of the functional circuitry.
Figure 9B:
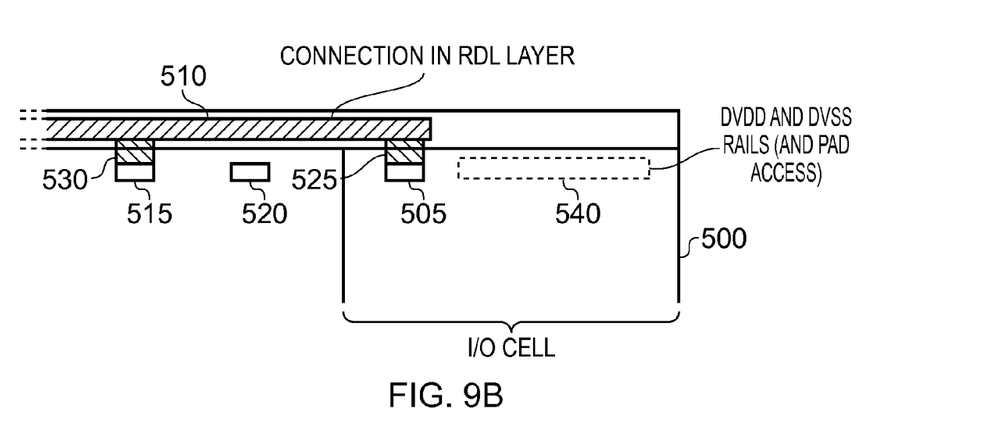

FIGS. 9A and 9B illustrate how the RDL layer may be used to provide a connection between the I/O cells and desired power lines within the power grid 100 of the functional circuitry. In particular, FIG. 9A shows a connection pin 505 provided in an upper layer of the I/O cell 500, which requires connecting to a VDD power line 515. This is achieved by the use of via connections (indicated by the "X"s shown in FIG. 9A) to an overlying connection path 510 within the RDL layer. That connection path 510 extends over the top of the VDD line 515 and again a series of vias are used to then connect that RDL connection path down to the VDD line 515. The via connections are shown by the elements 525, 530 in FIG. 9B. As can be seen, the RDL connection path 510 enables the VSS line 520 to be readily bypassed. The various DVDD and DVSS lines (along with the pad access connection) are shown schematically by the dotted box 540 in FIG. 9B.

Figure 10:
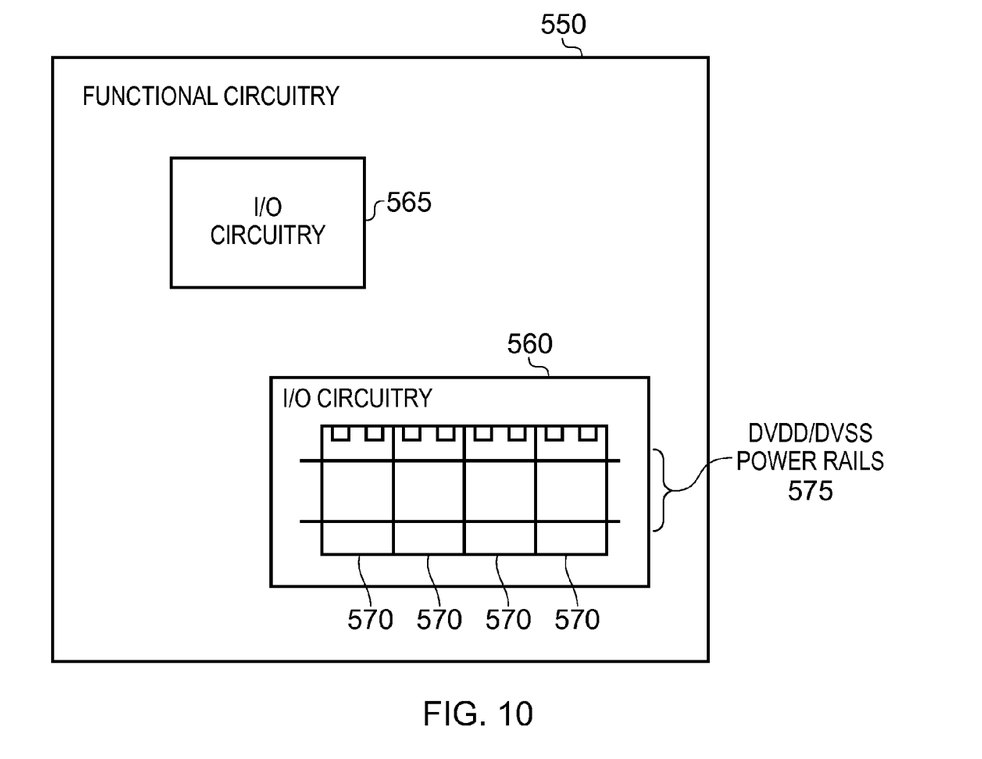
FIG. 10 schematically illustrates an alternative integrated circuit in which the techniques of embodiments may be employed.

Whilst in the above embodiments, the example where the interface circuitry is formed as an I/O ring has been used, the described techniques are not limited to situations where the interface circuitry takes the form of an I/O ring. FIG. 10 illustrates an alternative embodiment where the interface circuitry may be distributed in clusters within the functional circuitry 550 of the integrated circuit. Two clusters 560 and 565 are shown. Each cluster will be similarly constructed and, as shown for the example of the cluster 560, the interface circuitry within each cluster will comprise a series of I/O cells 570 arranged in an abutting relationship to establish the required DVDD and DVSS power rails 575. Since the modified design of FIG. 4 is used, there is no need for the provision of additional VDD and VSS power rails, and instead separate connection pins are provided to enable the I/O cells to be connected to a power grid associated with the functional circuitry.

In the arrangement shown in FIG. 10, the power distribution grid will overlie the functional circuitry, with holes in the grid being present to allow the insertion of the I/O circuit clusters 560, 565. The individual I/O cells within the clusters can be connected to the power grid in much the same way as discussed with reference to the earlier embodiments. Due to the reduced height of the individual I/O cells, this will result in a reduced area requirement for the I/O clusters, and accordingly enable a reduction in the overall area of the integrated circuit.

From the above described embodiments, it will be appreciated that such embodiments enable the overall area associated with the power supply line structure to be reduced, thereby enabling a reduction in the size of the individual I/O cells used to construct the interface circuitry of the integrated circuit. This is achieved whilst still enabling the current carrying constraints to be met. In particular, the lines used within the power supply line structure to provide the second power supply to the interface components can still be similarly sized to those in accordance with known prior art techniques, in order to allow the ESD protection requirements to be met. However, no additional lines are required within the power supply line structure to provide the first power supply, and instead the first power supply is obtained directly from the power supply distribution network of the functional circuitry. The power supply distribution network also has the added benefit of providing a more homogenous current distribution within the components of the I/O cells using the first power supply.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

The invention claimed is:

1. An integrated circuit comprising:
   functional circuitry comprising functional components configured to perform processing functions required by the integrated circuit, the functional circuitry configured to operate from a first power supply;
   a power supply distribution network associated with the functional circuitry and configured to provide said first power supply to the functional components;
   interface circuitry configured to provide an interface between the functional circuitry and components external to the integrated circuit, the interface circuitry comprising a plurality of interface cells having interface components configured to operate from a second power supply different to the first power supply;
   a power supply line structure shared by said plurality of interface cells, and configured to provide said second power supply to the interface components; and at least a subset of said interface cells further comprising additional interface components configured to operate from said first power supply, each interface cell in said at least a subset having an independent connection to the power supply distribution network in order to receive the first power supply.

2. The integrated circuit of claim 1, wherein:
each interface cell incorporates a power supply line section extending across its width, and the power supply line structure is formed from multiple power supply line sections by positioning the interface cells in an abutting arrangement such that the power supply line section in one interface cell contacts the power supply line section in an adjacent interface cell.

3. The integrated circuit of claim 1, wherein each interface cell in said at least a subset includes a connection area from which the independent connection to the power supply distribution network is made to receive the first power supply.

4. The integrated circuit of claim 3, wherein said connection area comprises one or more connection pins.

5. The integrated circuit of claim 3, wherein:
the interface circuitry is arranged as an interface ring provided around a periphery of the functional circuitry; and
the power supply line structure provides at least one power supply line extending around the interface ring.

6. The integrated circuit of claim 5, wherein each interface cell in said at least a subset is arranged within the interface ring such that the connection area is nearer the periphery of the functional circuitry than the power supply line structure.

7. The integrated circuit of claim 1, wherein the power supply distribution network is provided in one or more layers, and is configured to overlie the functional circuitry.

8. The integrated circuit of claim 7, wherein the power supply line structure occupies at least one layer used to provide the power supply distribution network.

9. The integrated circuit of claim 7, wherein said independent connection includes a connection path extending within at least one of the layers used for the power supply distribution network.

10. The integrated circuit of claim 7, wherein said independent connection includes a connection path extending within an additional layer overlying the one or more layers providing the power supply distribution network.

11. The integrated circuit of claim 1, wherein the power supply line structure is configured to provide an operating voltage level for said second power supply.

12. The integrated circuit of claim 1, wherein the power supply line structure is configured to provide a ground voltage level for said second power supply.

13. The integrated circuit of claim 1, wherein the power supply distribution network comprises a power grid.

14. An integrated circuit, comprising:
an interface cell for use within interface circuitry of the integrated circuit, wherein the interface circuitry is configured to provide an interface between functional circuitry of the integrated circuit operating from a first power supply and components external to the integrated circuit, wherein the interface circuitry comprises:
a power supply line section configured for coupling to power supply line sections of other interface cells to provide a power supply line structure shared with said other interface cells, and to provide a second power supply to at least one interface component within the interface circuitry, wherein the second power supply is different than the first power supply;
at least one additional interface component configured to operate from the first power supply; and
a connection area configured for making an independent connection to a power supply distribution network associated with the functional circuitry to provide the first power supply to the at least one additional interface component.

15. The integrated circuit of claim 14, further comprising at least one interface component configured to operate from the second power supply.

16. A computer storage medium comprising:
a cell library, wherein the cell library includes an interface cell for use within interface circuitry of an integrated circuit, the interface circuitry providing an interface between functional circuitry of the integrated circuit operating from a first power supply and components external to the integrated circuit, the interface circuitry comprising:
a power supply line section configured for coupling to power supply line sections of other interface cells to provide a power supply line structure shared with said other interface cells, and to provide a second power supply to at least one interface component within the interface circuitry, wherein the second power supply is different to the first power supply;
at least one additional interface component configured to operate from the first power supply; and
a connection area configured for making an independent connection to a power supply distribution network associated with the functional circuitry and to provide the first power supply to the at least one additional interface component.

17. A device, comprising:
processing circuitry having processing components;
a power supply distribution network configured to provide a first power supply to the processing components;
interface circuitry configured to interface the processing components with external components, wherein the interface circuitry comprises interface cells having first interface components configured to operate from a second power supply that is different than the first power supply;
a power supply line structure shared by the interface cells, and configured to provide the second power supply to the first interface components; and
at least one subset of the interface cells comprising second interface components configured to operate from the first power supply, wherein each interface cell in the at least one subset comprises an independent connection to the power supply distribution network to receive the first power supply.

18. The device of claim 17, wherein each interface cell incorporates a power supply line section extending across its width, and the power supply line structure is formed from multiple power supply line sections by positioning the interface cells in an abutting arrangement such that the power supply line section in one interface cell contacts the power supply line section in an adjacent interface cell.

19. The device of claim 17, wherein each interface cell in the at least one subset comprises a connection area from which the independent connection to the power supply distribution network is made to receive the first power supply, and wherein the connection area comprises one or more connection pins.

20. The device of claim 17, wherein the interface circuitry is arranged as an interface ring provided around a periphery of the processing circuitry, and wherein the power supply line structure provides at least one power supply line extending around the interface ring.

* * * * *